United States Patent
Thomas et al.

(10) Patent No.: US 9,519,609 B2
(45) Date of Patent: *Dec. 13, 2016

(54) ON-PACKAGE INPUT/OUTPUT ARCHITECTURE

(75) Inventors: Thomas P. Thomas, Beaverton, OR (US); Rajesh Kumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 562 days.

This patent is subject to a terminal disclaimer.

(21) Appl. No.: 13/995,007

(22) PCT Filed: Dec. 22, 2011

(86) PCT No.: PCT/US2011/066971
§ 371 (c)(1),
(2), (4) Date: Jun. 17, 2013

(87) PCT Pub. No.: WO2013/095536
PCT Pub. Date: Jun. 27, 2013

(65) Prior Publication Data
US 2013/0318266 A1    Nov. 28, 2013

(51) Int. Cl.
*G06F 13/40* (2006.01)
*G06F 13/38* (2006.01)

(52) U.S. Cl.
CPC ........... *G06F 13/4072* (2013.01); *G06F 13/40* (2013.01); *G06F 13/4086* (2013.01);
(Continued)

(58) Field of Classification Search
CPC .......... G06F 13/00; G06F 13/38; G06F 13/40; G06F 13/4063; G06F 13/4068; G06F 13/4072; G06F 13/4086; G06F 13/385; Y02B 60/1228; Y02B 60/1235
See application file for complete search history.

(56) References Cited

U.S. PATENT DOCUMENTS 6,246,721 B1 * 6/2001 Zhang ..................... G06F 1/10
                                                                   327/247
6,968,024 B1    11/2005   Perino
(Continued)

FOREIGN PATENT DOCUMENTS

| CN | 1725489 A | 1/2006 |
|---|---|---|
| CN | 102214621 A | 10/2011 |
| WO | WO-2006060441 | 6/2006 |

OTHER PUBLICATIONS

Shockman, Paul. "Termination of ECL Logic Devices". Application Note AND8020/D. Revision 2. ON Semiconductor. May 2002.*

(Continued)

*Primary Examiner* — Thomas J Cleary
(74) *Attorney, Agent, or Firm* — Blakely, Sokoloff, Taylor & Zafman LLP

(57) ABSTRACT

An on-package interface. A first set of single-ended transmitter circuits on a first die. The transmitter circuits are impedance matched and have no equalization. A first set of single-ended receiver circuits on a second die. The receiver circuits have no termination and no equalization. A plurality of conductive lines couple the first set of transmitter circuits and the first set of receiver circuits. The lengths of the plurality of conductive lines are matched.

15 Claims, 4 Drawing Sheets

(52) U.S. Cl.
CPC .... *G06F 13/385* (2013.01); *H01L 2924/0002* (2013.01); *Y02B 60/1228* (2013.01); *Y02B 60/1235* (2013.01)

(56) References Cited

U.S. PATENT DOCUMENTS

| | | | | |
|---|---|---|---|---|
| 6,998,870 | B1* | 2/2006 | Gulick | H04L 25/0278 |
| | | | | 326/26 |
| 7,205,787 | B1 | 4/2007 | Massoumi et al. | |
| 7,509,609 | B2 | 3/2009 | Davidovic | |
| 7,519,396 | B2 | 4/2009 | Hashimoto | |
| 7,526,256 | B2 | 4/2009 | Bhatti et al. | |
| 8,736,328 | B2* | 5/2014 | Kurd | H03L 7/22 |
| | | | | 327/158 |
| 8,946,742 | B2 | 2/2015 | Yu | |
| 9,143,120 | B2* | 9/2015 | Osborne | G06F 1/32 |
| 2003/0180988 | A1* | 9/2003 | Kikuma | H01L 23/3128 |
| | | | | 438/127 |
| 2005/0200380 | A1* | 9/2005 | Rapport | H04L 25/0298 |
| | | | | 326/30 |
| 2007/0250765 | A1* | 10/2007 | Chen | G06F 17/246 |
| | | | | 715/234 |
| 2008/0018357 | A1* | 1/2008 | Peterson | H03H 7/40 |
| | | | | 326/30 |
| 2008/0320247 | A1* | 12/2008 | Morfey | G06F 1/24 |
| | | | | 711/154 |
| 2013/0313709 | A1* | 11/2013 | Hinck | H01L 25/0655 |
| | | | | 257/738 |
| 2013/0326205 | A1* | 12/2013 | Kulick | G06F 1/24 |
| | | | | 713/1 |
| 2014/0201405 | A1* | 7/2014 | Thomas | G06F 13/14 |
| | | | | 710/110 |

OTHER PUBLICATIONS

Bogatin, Eric. "Handbook of Packaging Technology". Integrated Circuit Engineering Corporation. 1997. Chapter 12. pp. 12-1-12-76. ISBN 1-877750-61-1.*

"Multi-Chip Packages". National Semiconductor Corporation. Apr. 2000. MS011801.*

International Search Report and Written Opinion for PCT/US2011/066971 mailed Sep. 24, 2012, 9 pages.

International Preliminary Report on Patentability for PCT/US2011/066971 mailed Jul. 3, 2014, 6 pages.

* cited by examiner

ON-PACKAGE INPUT/OUTPUT ARCHITECTURE

TECHNICAL FIELD

Embodiments of the invention relate to input/output architectures and interfaces. More particularly, embodiments of the invention relate to high-bandwidth on-package input/output architectures and interfaces.

BACKGROUND

High bandwidth interconnections between chips using conventional input/output (I/O) interfaces require significant power and chip area. Thus, in applications requiring significantly reduced power consumption and/or smaller chip area, these conventional interfaces are not desirable.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Described herein is an On-Package I/O (OPIO) interface that solves the problems of conventional I/O interfaces by providing very high bandwidth I/O between chips in a Multi Chip Package (MCP) with very low power, area and latency. OPIO may be useful, for example, to interconnect a processor to memory (eDRAM/DRAM), another processor, a chip set, a graphics processor, or any other chip in a MCP with an order of magnitude lower energy per bit and area per bandwidth compared to conventional I/O.

Various embodiments of the interfaces described herein include one or more of the following components: (1) a single-ended, high-speed I/O interface (e.g., CMOS interface) between IC chips in a MCP with a relatively small die-to-die gap; (2) an impedance matched transmitter (e.g., CMOS transmitter) with no receiver termination or very weak termination, and no equalization; (3) a forwarded clock signal for a cluster of signals with length-matched routing to minimize or eliminate per pin de-skew; and/or (4) reduced electrostatic discharge (ESD) protection (e.g., 70 V) to provide lower pad capacitances and higher data rates.

Close chip assembly in MCP enables very short length matched I/O traces, which in turn enables OPIO architectures described herein to run at high bandwidth using simplified single-ended I/O and clocking circuits to reduce power, area and latency. In one embodiment, high-speed, single-ended I/O with minimum bump pitch reduces bump limited silicon area for required bandwidth.

In one embodiment, use of a CMOS transmitter and receiver with no or weak receiver termination and no equalization can reduce I/O power. Simplified clocking with forwarded clock per cluster of signals and no per pin de-skew can be achieved due to careful length matched routing reduces clock power. Thus, the OPIO architectures described herein provide high bandwidth between chips at very low power, area and latency. MCP with OPIO provides product, process and die area flexibility without significant power and area overhead. The OPIO architectures described herein can also be extended to close discrete packages with full ESD protection for small form factor mobile applications at lower data rates. Multi-level (e.g., M-PAM) signaling can be used at higher data rates to keep the clock frequency down.

Figure 1:
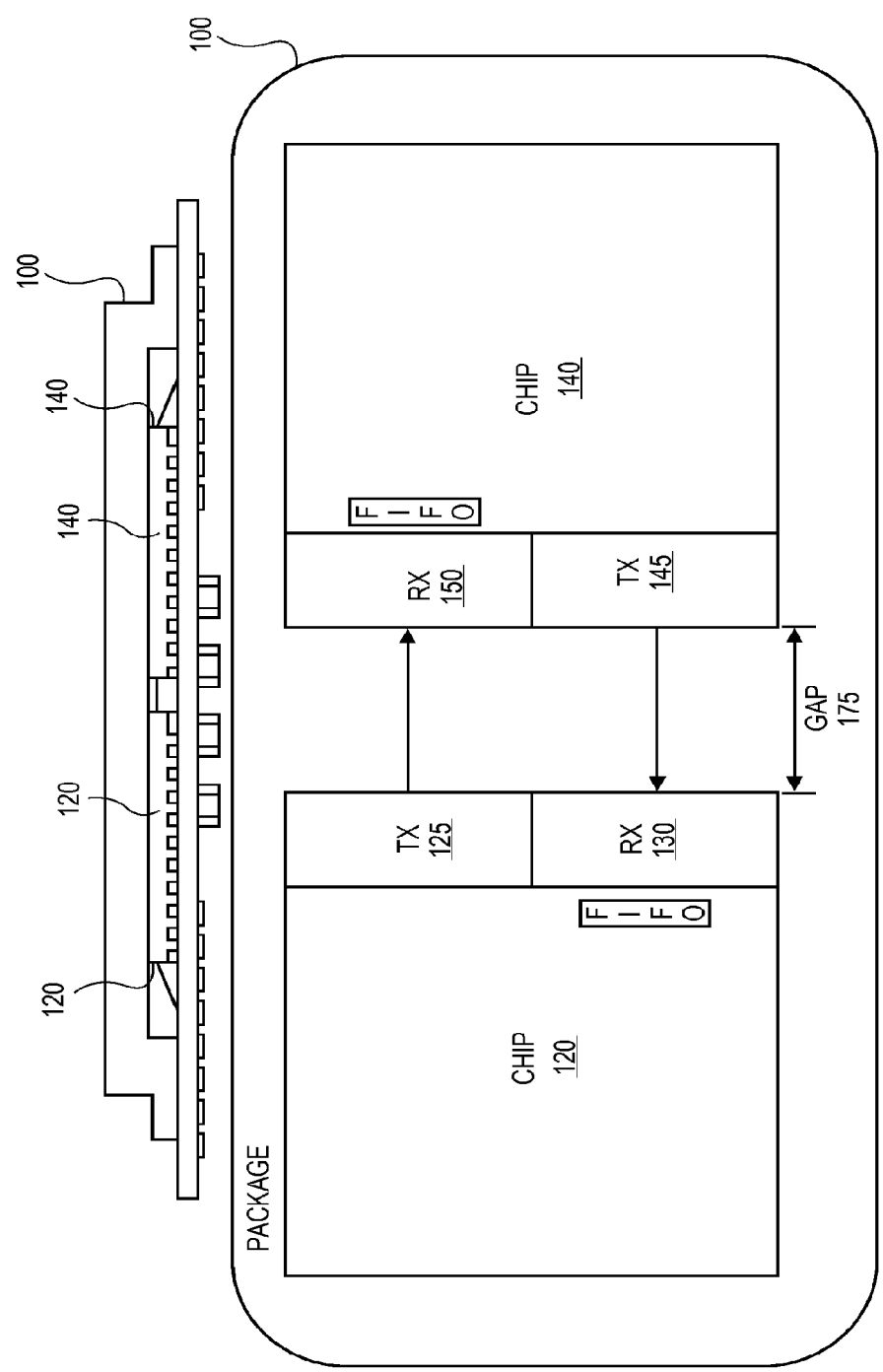
FIG. 1 is a block diagram of one embodiment of a multichip package (MCP) having on-package input/output (OPIO) interfaces between at least two chips.

FIG. 1 is a block diagram of one embodiment of a multichip package (MCP) having on-package input/output (OPIO) interfaces between at least two chips. The example of FIG. 1 illustrates two chips with interfaces; however, any number of chips within a package can be interconnected using the techniques described herein.

Package 100 may be any type of package that may contain multiple integrated circuit chips. In the example of FIG. 1, package 100 contains chip 120 and chip 140. These chips may be, for example, processors, memory chips, graphics processors, etc.

In one embodiment, chip 120 includes OPIO transmitters 125 and OPIO receivers 130. Similarly, chip 140 includes OPIO transmitters 145 and OPIO receivers 150. Transmitters 125 are coupled with receivers 150 and transmitters 145 are coupled with receivers 130.

In one embodiment, gap 175 between chip 120 and chip 140 is relatively small. In one embodiment, gap 175 is less than 20 mm. In one embodiment, gap 175 is less than 10 mm. In one embodiment, gap 175 is approximately 1.5 mm. In other embodiments, gap 175 may be less than 1.5 mm. In general, the smaller gap 175, the greater the bandwidth that may be provided between chips.

In one embodiment, the interfaces between transmitter 125 and receiver 150, and between transmitter 145 and receiver 130 are single-ended, relatively high-speed interfaces. In one embodiment, the interfaces are CMOS interfaces between chip 120 and chip 140. In one embodiment, transmitters 125 and 145 are impedance matched CMOS transmitters and no termination or equalization is provided. In one embodiment, transmitters 125 and 145 are impedance matched CMOS transmitters and very weak termination and no equalization is provided.

In one embodiment, a forwarded clock signal is transmitted for a cluster of signals. In one embodiment, length-matched routing is provided between the transmitters and the receivers. In one embodiment, minimal electrostatic discharge (ESD) protection (as little as 70 Volts) is provided for the interfaces between chips 120 and 140.

In one embodiment, use of a CMOS transmitter and receiver with no or weak receiver termination and no equalization can reduce I/O power. Simplified clocking with forwarded clock per cluster of signals and no per pin de-skew can be achieved due to careful length matched routing reduces clock power. Thus, the architectures described herein provide high bandwidth between chips at very low power, area and latency.

The architectures described herein can also be extended to close discrete packages with full ESD protection for small form factor mobile applications at lower data rates. Multi-level (e.g., M-PAM) signaling can be used at higher data rates to keep the clock frequency down.

Figure 2:
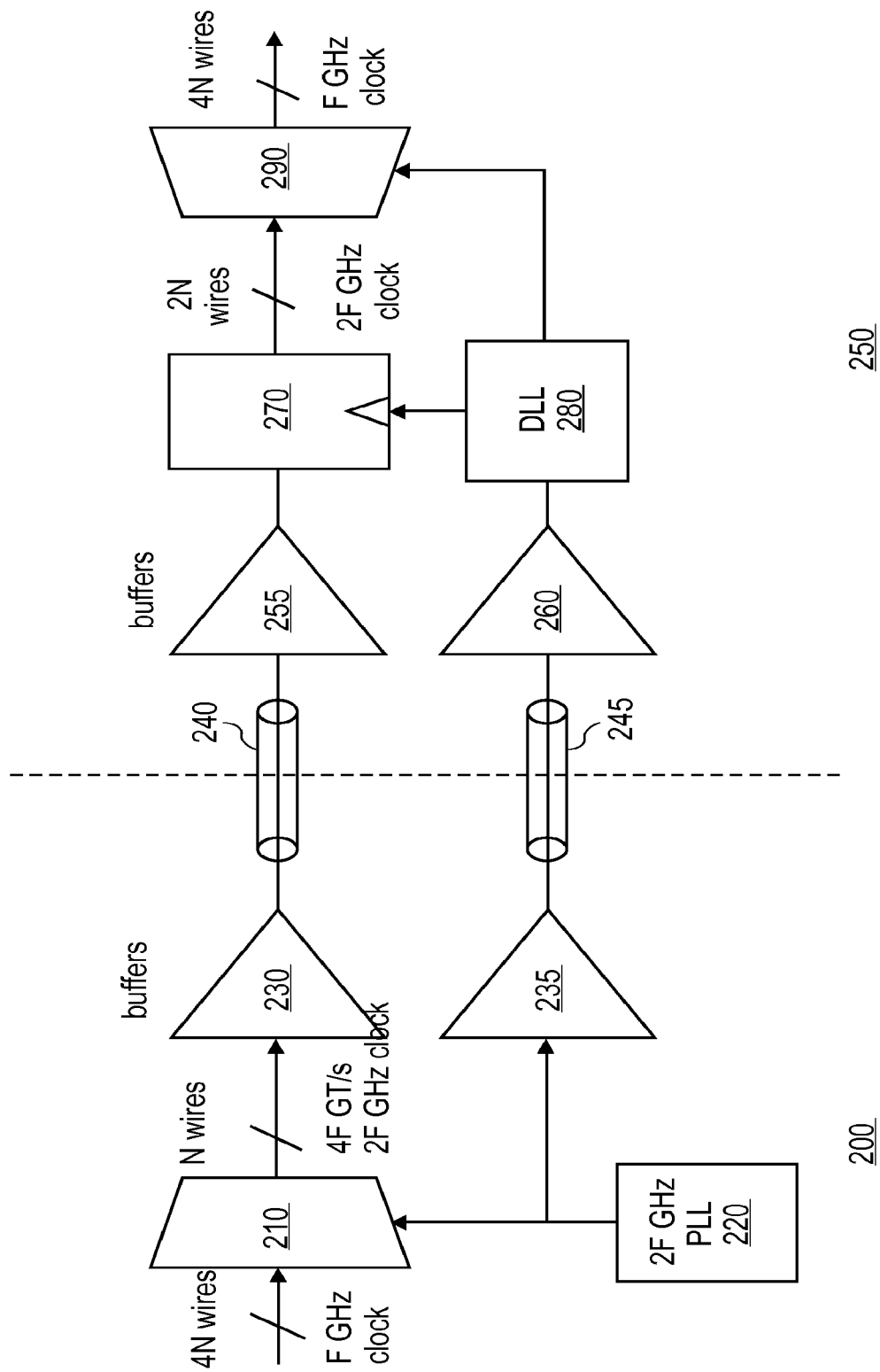
FIG. 2 is a diagram of one embodiment of a physical layer interface.

FIG. 2 is a diagram of one embodiment of a physical layer interface. The physical layer interface of FIG. 2 may provide the interfaces described above with respect to FIG. 1. Chip 200 and chip 250 reside in a single package and are physically positioned with a relatively small gap between them, as described above.

The example of FIG. 2 provides transmission from chip 200 to chip 250. A similar physical layer interface may be used to transmit from chip 250 to chip 200. The example of FIG. 2 provides a 4:1 multiplexing mechanism, which is optional and be eliminated for certain embodiments or other multiplexing ratios may be supported based on, for example, transmission speeds compared to internal clock signals, etc.

In one embodiment, multiplexor 210 receives as input signals from 4N lines and a clock signal at F GHz. In one embodiment, multiplexor 210 is driven by a clock signal from 2F GHz phase locked loop (PLL) 220.

In one embodiment, the signal from 2F GHz PLL 220 is also provide to buffer 235 to be transmitted to chip 250 over transmission line 245. In one embodiment, only one such forwarded clock signal is sent per cluster of N data signals, where N can be one or more bytes (N=8, 16, 32 data bits for example). Multiplexor 210 multiplexes the 4N signals to N lines to be provided to buffer(s) 230 for transmission to chip 250 over transmission line(s) 240.

Buffer 260 on chip 250 receives the 2F GHz clock signal from transmission line 245. Similarly, buffer(s) 255 receive the signals from N lines over transmission line(s) 240. In one embodiment, the 2F GHz signal from buffer 260 drives digital locked loop (DLL) 280, which in turn drives sampler 270.

Sampler 270 latches the signals from N lines received from buffer 255 to 2N lines with a 2F GHz clock signal using both edges of the clock, which are sent to demultiplexor 290, also driven by DLL 280. Demultiplexor 290 recovers the signals from the 4N lines and the F GHz clock signal originally received by multiplexor 210 on chip 200. Thus, the signals from the 4N lines may be transmitted from chip 200 to chip 250 over transmission lines 240 and 245.

Figure 3:
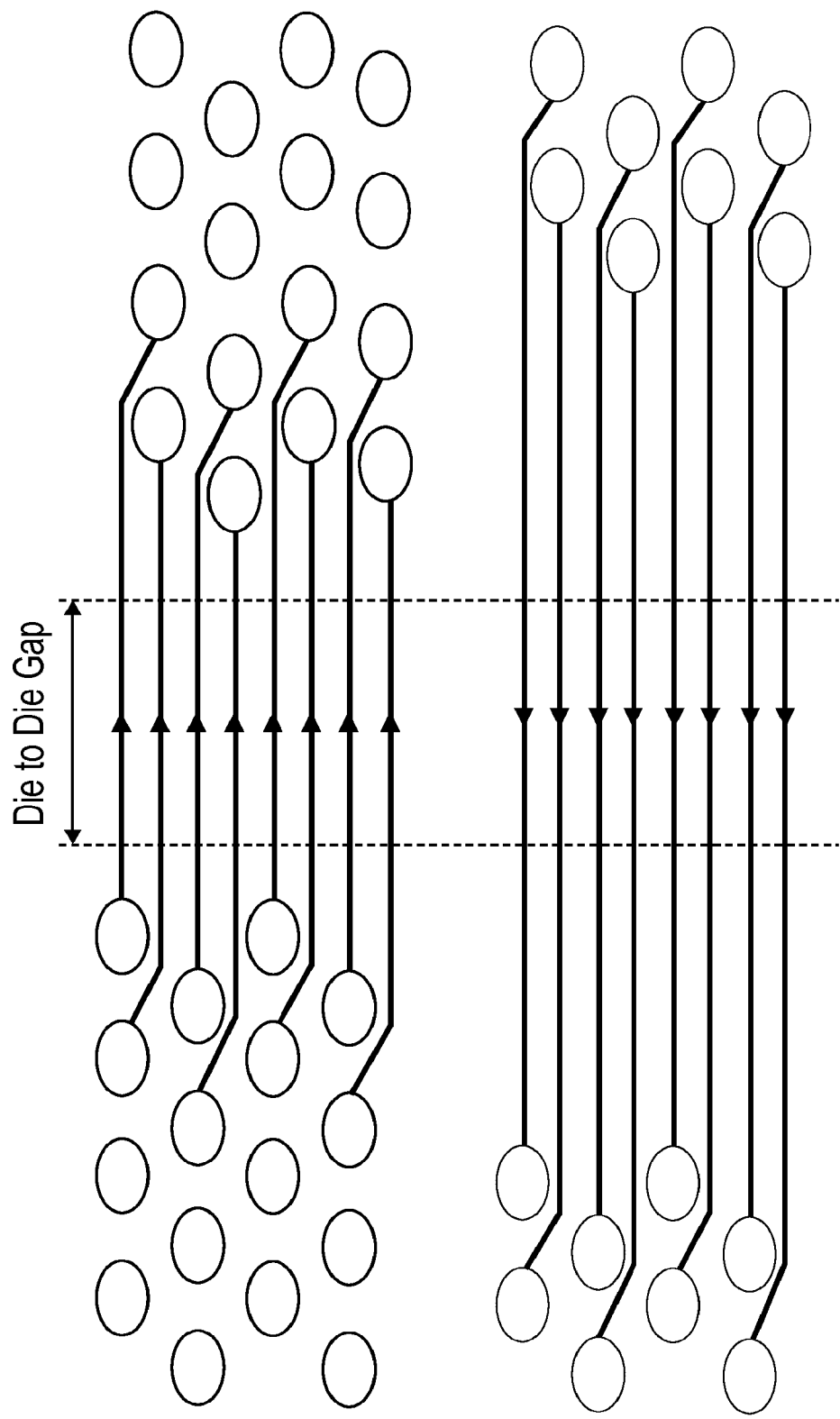
FIG. 3 is a diagram of one embodiment of length-matched routing to avoid per-pin de-skew.

FIG. 3 is a diagram of one embodiment of length-matched routing to avoid per-pin de-skew. Close chip assembly in a MCP may enable very short, length-matched interface lines, which support higher bandwidth transmissions using single-ended I/O and clocking circuits. High-speed, single-ended I/O interfaces with minimal bump pitch reduces bump-limited silicon area, thus providing a more area efficient interface.

Figure 4:
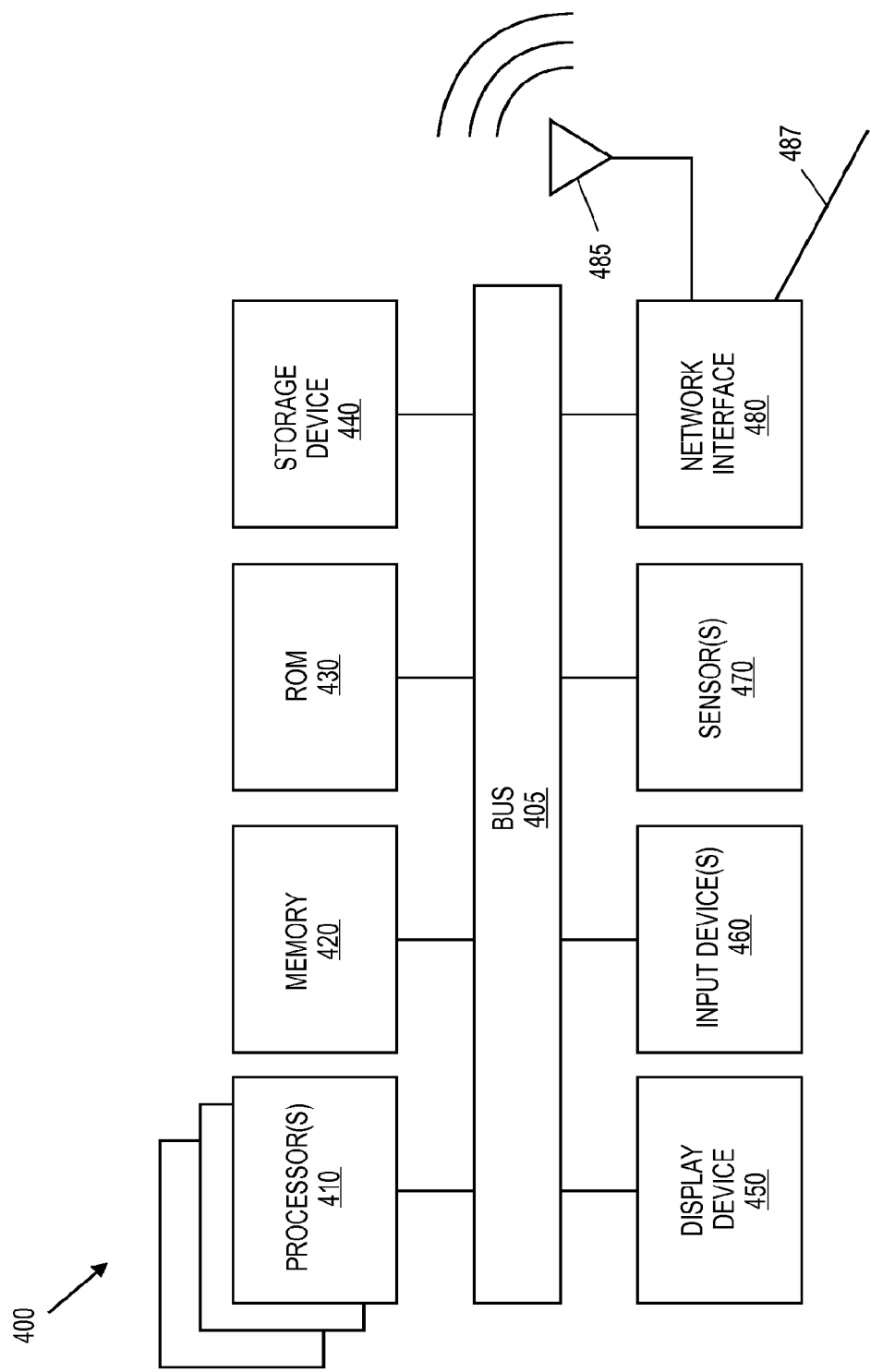
FIG. 4 is a block diagram of one embodiment of an electronic system.

FIG. 4 is a block diagram of one embodiment of an electronic system. The electronic system illustrated in FIG. 4 is intended to represent a range of electronic systems (either wired or wireless) including, for example, a tablet device, a smartphone, a desktop computer system, a laptop computer system, a server etc. Alternative electronic systems may include more, fewer and/or different components.

One or more of the components illustrated in FIG. 4 may be interconnected utilizing the OPIO architectures described herein. For example, multiple processor chips may be interconnected, or a processor and a cache memory or dynamic random access memory, etc.

Electronic system 400 includes bus 405 or other communication device to communicate information, and processor(s) 410 coupled to bus 405 that may process information. Electronic system 400 may include multiple processors and/or co-processors. Electronic system 400 further may include random access memory (RAM) or other dynamic storage device 420 (referred to as memory), coupled to bus 405 and may store information and instructions that may be executed by processor 410. Memory 420 may also be used to store temporary variables or other intermediate information during execution of instructions by processor(s) 410.

Electronic system 400 may also include read only memory (ROM) and/or other static storage device 430 coupled to bus 405 that may store static information and instructions for processor 410. Data storage device 440 may be coupled to bus 405 to store information and instructions. Data storage device 440 such as a magnetic disk or optical disc and corresponding drive may be coupled to electronic system 400.

Electronic system 400 may also be coupled via bus 405 to display device 450, which can be any type of display device, to display information to a user, for example, a touch screen. Input device 460 may be any type of interface and/or device to allow a user to provide input to electronic system 400. Input device may include hard buttons and/or soft buttons, voice or speaker input, to communicate information and command selections to processor(s) 410.

Electronic system 400 may further include sensors 470 that may be used to support functionality provided by Electronic system 400. Sensors 470 may include, for example, a gyroscope, a proximity sensor, a light sensor, etc. Any number of sensors and sensor types may be supported.

Electronic system 400 further may include network interface(s) 480 to provide access to a network, such as a local area network. Network interface(s) 480 may include, for example, a wireless network interface having antenna 485, which may represent one or more antenna(e). Network interface(s) 480 may also include, for example, a wired network interface to communicate with remote devices via network cable 487, which may be, for example, an Ethernet cable, a coaxial cable, a fiber optic cable, a serial cable, or a parallel cable. Network access may also be provided in accordance with 4G/LTE standards as well.

In one embodiment, network interface(s) 480 may provide access to a local area network, for example, by conforming to IEEE 802.11b and/or IEEE 802.11g and/or IEEE 802.11n standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 480 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
   a first set of single-ended transmitter circuits on a first die having input/outputs (I/Os), the first die within a semiconductor package, wherein the transmitter circuits are impedance matched and have no equalization;
   a first set of single-ended receiver circuits on a second die having I/Os, the second die within the semiconductor package, wherein the receiver circuits have no termination and no equalization; and
   a plurality of conductive lines disposed on a planar board that are each directly coupled to both the I/Os of first die and the I/Os of the second die to directly couple the first set of transmitter circuits and the first set of receiver circuits, wherein the lengths of the plurality of conductive lines are matched, and wherein the I/Os of the first die and the I/Os of the second die couple to the planar board beneath the first die and second die respectively and are not pins that couple into sockets.

2. The apparatus of claim 1 further comprising:
   a second set of single-ended receiver circuits on the first die, wherein the second set of single-ended receiver circuits have no termination and no equalization;
   a second set of single-ended transmitter circuits on the second die, wherein the second set of transmitter circuits are impedance matched and have no equalization; and
   a plurality of conductive lines between the second set of transmitter circuits and the second set of receiver circuits, wherein the lengths of the plurality of conductive lines are matched.

3. The apparatus of claim 1, wherein the first die comprises at least a processor core, the apparatus further comprising a touch screen interface coupled with the processor core.

4. The apparatus of claim 1 wherein a gap between the first die and the second die is less than 20 mm.

5. The apparatus of claim 4 wherein the gap is equal to or less than 1.5 mm.

6. A tablet computing device comprising:
   a touch screen interface;
   a first set of single-ended transmitter circuits on a first die, the first die within a semiconductor package, wherein the transmitter circuits are impedance matched and have no equalization;
   a first set of single-ended receiver circuits on a second die, the second die within a semiconductor package, wherein the receiver circuits have no termination and no equalization; and
   a plurality of conductive lines disposed on a planar board that are each directly coupled to both the I/Os of first die and the I/Os of the second die to directly couple the first set of transmitter circuits and the first set of receiver circuits, wherein the lengths of the plurality of conductive lines are matched, and wherein the I/Os of the first die and the I/Os of the second die couple to the planar board beneath the first die and second die respectively and are not pins that couple into sockets.

7. The tablet of claim 6 further comprising:
   a second set of single-ended receiver circuits on the first die, wherein the second set of single-ended receiver circuits have no termination and no equalization;
   a second set of single-ended transmitter circuits on the second die, wherein the second set of single-ended transmitter circuits are impedance matched and have no equalization; and
   a plurality of conductive lines between the second set of transmitter circuits and the second set of receiver circuits, wherein the lengths of the plurality of conductive lines are matched.

8. The tablet of claim 6 further comprising an antenna for communication.

9. The tablet of claim 6 wherein a gap between the first die and the second die is less than 20 mm.

10. The tablet of claim 9 wherein the gap is equal to or less than 1.5 mm.

11. A system comprising:
    an omnidirectional antenna;
    a first set of single-ended transmitter circuits on a first die, the first die within a semiconductor package, wherein the transmitter circuits are impedance matched and have no equalization;
    a first set of single-ended receiver circuits on a second die, the second die within the semiconductor package, wherein the receiver circuits have no termination and no equalization; and
    a plurality of conductive lines disposed on a planar board that are each directly coupled to both the I/Os of first die and the I/Os of the second die to directly couple the first set of transmitter circuits and the first set of receiver circuits, wherein the lengths of the plurality of conductive lines are matched, and wherein the I/Os of the first die and the I/Os of the second die couple to the planar board beneath the first die and second die respectively and are not pins that couple into sockets.

12. The system of claim 11 further comprising:
    a second set of single-ended receiver circuits on the first die, wherein the second set of single-ended receiver circuits have no termination and no equalization;
    a second set of single-ended transmitter circuits on the second die, wherein the second set of single-ended transmitter circuits are impedance matched and have no equalization; and
    a plurality of conductive lines between the second set of transmitter circuits and the second set of receiver circuits, wherein the lengths of the plurality of conductive lines are matched.

13. The system of claim 11, wherein the first die comprises at least a processor core, the apparatus further comprising a touch screen interface coupled with the processor core.

14. The system of claim 11 wherein a gap between the first die and the second die is less than 20 mm.

15. The system of claim 14 wherein the gap is equal to or less than 1.5 mm.

* * * * *